US 7,410,885 B2

(12) United States Patent
Schuehrer et al.

(10) Patent No.: US 7,410,885 B2
(45) Date of Patent: Aug. 12, 2008

(54) METHOD OF REDUCING CONTAMINATION BY REMOVING AN INTERLAYER DIELECTRIC FROM THE SUBSTRATE EDGE

(75) Inventors: Holger Schuehrer, Dresden (DE); Christin Bartsch, Lauterbach (DE); Carsten Hartig, Meerane (DE)

(73) Assignee: Advanced Micro Devices, Inc., Austin, TX (US)

( * ) Notice: Subject to any disclaimer, the term of this patent is extended or adjusted under 35 U.S.C. 154(b) by 211 days.

(21) Appl. No.: 11/383,903

(22) Filed: May 17, 2006

(65) Prior Publication Data
US 2007/0026670 A1 Feb. 1, 2007

(30) Foreign Application Priority Data
Jul. 29, 2005 (DE) .................. 10 2005 035 728

(51) Int. Cl.
*H01L 21/30* (2006.01)
(52) U.S. Cl. ............. 438/455; 438/458; 257/E21.088; 257/E21.122; 257/E21.568
(58) Field of Classification Search ............. 438/455, 438/458; 257/E21.088, E21.122, E21.568
See application file for complete search history.

(56) References Cited

U.S. PATENT DOCUMENTS

| 5,426,073 | A | * | 6/1995 | Imaoka et al. | 438/597 |
| 5,897,379 | A | | 4/1999 | Ulrich et al. | 438/754 |
| 6,376,363 | B1 | | 4/2002 | Iguchi | 438/633 |
| 6,379,782 | B2 | | 4/2002 | Iguchi et al. | 428/209 |
| 6,940,150 | B2 | | 9/2005 | Watanabe | 257/622 |
| 2002/0106905 | A1 | | 8/2002 | Tran et al. | 438/754 |
| 2003/0045121 | A1 | | 3/2003 | Higashi | 438/758 |

FOREIGN PATENT DOCUMENTS
DE 103 26 273 A1 1/2005

\* cited by examiner

*Primary Examiner*—Thanh V Pham
(74) *Attorney, Agent, or Firm*—Williams, Morgan & Amerson

(57) ABSTRACT

By performing at least one additional wet chemical etch process in the edge region and in particular on the bevel of a substrate during the formation of a metallization layer, the dielectric material, especially the low-k dielectric material, may be reliably removed from the bevel prior to the formation of any barrier and metal layers. Moreover, an additional wet chemical etch process may be performed after the deposition of the metal to remove any unwanted metal and barrier material from the edge region and the bevel. Accordingly, defect issues and contamination of substrates and process tools may be efficiently reduced.

12 Claims, 7 Drawing Sheets

US 7,410,885 B2

METHOD OF REDUCING CONTAMINATION BY REMOVING AN INTERLAYER DIELECTRIC FROM THE SUBSTRATE EDGE

BACKGROUND OF THE INVENTION

1. Field of the Invention

Generally, the present invention relates to the fabrication of integrated circuits, and, more particularly, to the formation of metallization layers and contaminations related thereto in subsequent processes.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500 and more individual process steps in sophisticated integrated circuits, are performed simultaneously for all chip areas on the substrate, except for photolithography processes, certain metrology processes and packaging of the individual devices after dicing the substrate. Thus, economical constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral chips are positioned as closely as possible to the substrate perimeter as is compatible with substrate handling processes. Generally, most of the manufacturing processes are performed in an automated manner, wherein the substrate handling is performed at the back side of the substrate and/or the substrate edge, which typically includes a bevel at least at the front side of the substrate.

Due to the ongoing demand for shrinking the feature sizes of highly sophisticated semiconductor devices, copper and alloys thereof, in combination with a low-k dielectric material, have become a frequently used alternative in the formation of so-called metallization layers, which include metal lines and vias connecting individual circuit elements to provide the required functionality of the integrated circuit. Although copper exhibits significant advantages when compared to aluminum as being the typical metallization metal for the last decade, semiconductor manufacturers have been somewhat reluctant to introduce copper in the production owing to copper's ability to readily diffuse in silicon and silicon dioxide. Moreover, even when present in very small amounts, copper may significantly modify the electrical characteristics of silicon and, thus, the behavior of circuit elements, such as transistors and the like. It is, therefore, essential to confine the copper to the metal lines and vias by using appropriate insulating and conductive barrier layers to strongly suppress the diffusion of copper into sensitive device regions. Furthermore, any contamination of process tools, such as transport means, transport containers, robot arms, wafer chucks and the like, must be effectively restricted, since even minute amounts of copper deposited on the back side of a substrate may lead to diffusion of the copper into sensitive device areas.

The problem of copper and other device and tool contamination is even exacerbated when low-k dielectric materials are employed in combination with copper to form metallization layers, owing to the reduced mechanical stability of the low-k dielectrics. Since at least some of the deposition processes used in fabricating semiconductors may not be efficiently restricted to the "active" substrate area, a stack of layers or material residues may also be formed at the substrate edge region including the bevel, thereby generating a mechanically unstable layer stack, owing to process non-uniformities at the substrate edge and especially at the bevel of the substrate. In particular, low-k dielectrics formed by chemical vapor deposition (CVD) tend to adhere more intensively at the bevel edge region compared to the active substrate region, thereby building up an increased layer thickness that may be up to twice the thickness of the dielectric material in the active region. Thus, during the formation of a plurality of metallization layers, a layer stack at the bevel region may be formed that includes barrier material and dielectrics which exhibit a reduced adhesion to each other. During the further production and substrate handling processes, material, such as copper, barrier material and/or the dielectrics, may delaminate and significantly affect these processes, thereby negatively affecting production yield and tool integrity.

For instance, in forming a copper-based metallization layer, the so-called damascene technique is presently a preferred manufacturing method to create metal lines and vias. To this end, a dielectric layer, typically comprised of a low-K dielectric, is deposited and patterned to include trenches and vias in accordance with design requirements. Thereafter, a conductive barrier layer comprised of, for example, tantalum, tantalum nitride, titanium, titanium nitride and the like is deposited, wherein the composition of the barrier layer is selected so as to also improve the adhesion of the copper to the neighboring dielectric. The deposition of the barrier layer may be accomplished by CVD or physical vapor deposition (PVD), wherein a deposition of the barrier material may not be efficiently restricted to the active substrate area by presently established deposition techniques. Consequently, the barrier material may also be deposited at the substrate bevel and partially at the back side of the substrate, thereby forming, in combination with residues of the dielectric material that may not be efficiently removed by the previous etch processes for patterning the dielectric layer, a layer stack of reduced mechanical stability. Thereafter, according to a standard damascene process flow, a thin copper seed layer is deposited by PVD or similar appropriate processes to initiate and promote a subsequent electrochemical deposition process to fill the trenches and vias formed in the dielectric material.

Although reactor vessels for the electrochemical deposition, such as electroplating reactors or electroless plating reactors, may be designed such that substantially no copper is deposited at the substrate edge, the preceding seed layer deposition may nevertheless result in a significant deposition of unwanted copper at the substrate edge region. After the electro-chemical deposition of the bulk copper, any excess material has to be removed, which is frequently achieved by chemical mechanical polishing (CMP), wherein material fragments, such as copper pieces, may "flake off," owing to the reduced stability of the metallization layer stack especially at the substrate bevel. The copper-containing material flakes and other material flakes comprised of dielectric material and/or barrier material, for instance liberated during the CMP process, may then redeposit at unwanted substrate regions or may affect the CMP process of subsequent substrates. During the further processing of the substrate, a contamination, mainly caused by the delamination at the substrate edge, may occur and may especially adversely affect the so-called backend process flow, in which contact pads and solder bumps are formed.

Since contamination caused by, for instance, unwanted copper at the substrate edge has been identified as a major contamination source, great efforts are being made to remove copper from the substrate edge and the bevel without substantially affecting the inner, i.e., the active, substrate region. To this end, etch modules have been developed by semiconductor equipment providers, such as Semitool Inc., Novellus Inc. and the like, which are configured to selectively provide an agent substantially comprised of sulfuric acid and hydrogen peroxide to the substrate edge to remove unwanted copper from this region. Although the removal of unwanted copper from the substrate edge reduces the risk of copper contamination of subsequent processes, it turns out, however, that a significant reduction of production yield, especially in the manufacturing sequence for higher metallization layers and in the backend process flow, is still observable.

In view of the situation described above, a need exists to provide an improved technique for avoiding, or at least reducing the effects of, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of metallization layers of semiconductor devices and, in illustrative embodiments, of semiconductor devices including copper-based metal lines embedded in a low-k dielectric material with a reduced probability for substrate and/or tool contamination. For this purpose, the delamination of dielectric material and/or metallic material during the formation of a metallization layer may be significantly reduced in that at least the dielectric material is substantially completely removed from an edge region of the substrate prior to the deposition of any barrier material or metal. In this way, the formation of a mechanically unstable dielectric layer stack in the edge region and particularly at a bevel of the substrate may be substantially avoided. In some illustrative embodiments, after the selective removal of the dielectric material from the edge region of the substrate, conductive barrier material and metal may be filled into vias and/or trenches, wherein at least the barrier material, which is typically also deposited on the edge region, may also be selectively removed from the edge region and the bevel, thereby even further reducing the probability for the building up of mechanically unstable layers during the manufacturing of a plurality of metallization layers.

According to one illustrative embodiment of the present invention, a method comprises forming a dielectric layer stack for a metallization layer above a substrate having a central region adjacent to an edge region. The method further comprises selectively removing at least one layer of the dielectric layer stack from the edge region by selectively applying an etchant to the edge region. Moreover, the dielectric layer stack is patterned in the central region to receive a via and/or a trench. Finally, a conductive barrier layer is deposited above the patterned dielectric layer stack after selectively applying the etchant to the edge region.

BRIEF DESCRIPTION OF THE DRAWINGS

The invention may be understood by reference to the following description taken in conjunction with the accompanying drawings, in which like reference numerals identify like elements, and in which.

Figure 1A:
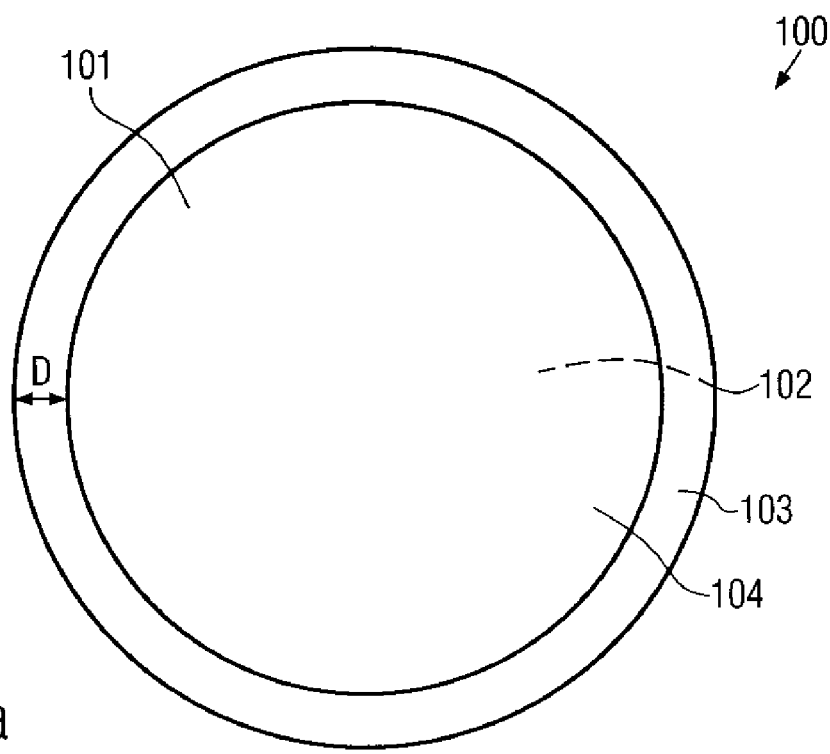
FIG. 1a schematically depicts a top view of a substrate including a device having an "active" region or a device region that is located adjacent to an edge region, which may include a bevel.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique that enables the formation of a metallization layer with a reduced probability of substrate and tool contamination. It is believed that the formation of mechanically unstable dielectric layer stacks on the edge region, and in particular on the bevel, of the substrate may significantly contribute to the overall contamination and defect rate in this manufacturing phase and in subsequent processes. By selectively removing dielectric residues on the substrate edge and bevel, which may not be completely removed by the anisotropic etch processes used for patterning the dielectric layer stack, the formation of these unwanted unstable layer stacks may significantly be avoided, thereby significantly reducing the risk of "flaking" off of dielectric and metallic material during the further processing of the substrate. It should be appreciated that the present invention is particularly advantageous in the context of metallization layers including copper and copper alloys in combination with low-k dielectric materials, since, as previously explained, during the deposition of the low-k dielectric materials, which may per se exhibit a reduced mechanical stability and adhesion compared to conventional dielectric materials, such as silicon dioxide, silicon nitride and the like, an increased layer thickness may be created on the bevel region, thereby enhancing even more the risk of material delamination during subsequent substrate handling and manufacturing processes. The present invention may, however, also be applied in combination with other metallization schemes, thereby improving production yield due to a significant reduction of particles created by substrate handling processes, CMP processes and the like. Thus, unless otherwise explicitly specified in the description and the appended claims, the present invention should not be restricted to a specific material composition of the dielectric materials and the conductive materials used for the formation of metallization layers.

With reference to FIGS. 1a-1j and FIGS. 2a-2d, further illustrative embodiments of the present invention will now be described in more detail. FIG. 1a schematically depicts a substrate 100 having a front side 101 on which circuit elements may be formed, and having a back side 102 which is frequently in contact with any type of substrate holders during the transport and processing of the substrate 100. The front side 101 of the substrate 100 may be divided into an "active" or central region 104, within which the plurality of individual chips are to be arranged, and into an edge region 103, which may not be used for the fabrication of circuit elements due to process non-uniformities, substrate handling requirements and the like, wherein particularly deposition non-uniformities may occur at the vicinity of the substrate perimeter that typically includes a bevel, as will be described in more detail with reference to FIG. 1b. The size of the edge region 103 and thus of the central region 104 depends on the controllability of the processes involved in manufacturing circuit elements in and on the central region 104, the capability of transport means used for supporting and transporting the substrate 100 between subsequent processes and the like. Desirably, the size of the edge region 103 may be kept as small as possible to arrange as many chip areas as possible on the central region 104. Presently, 200 mm and 300 mm are typical diameters of substrates used in modern semiconductor facilities, wherein a size D of the edge region 103 may range from approximately 1-5 mm.

Figure 1B:
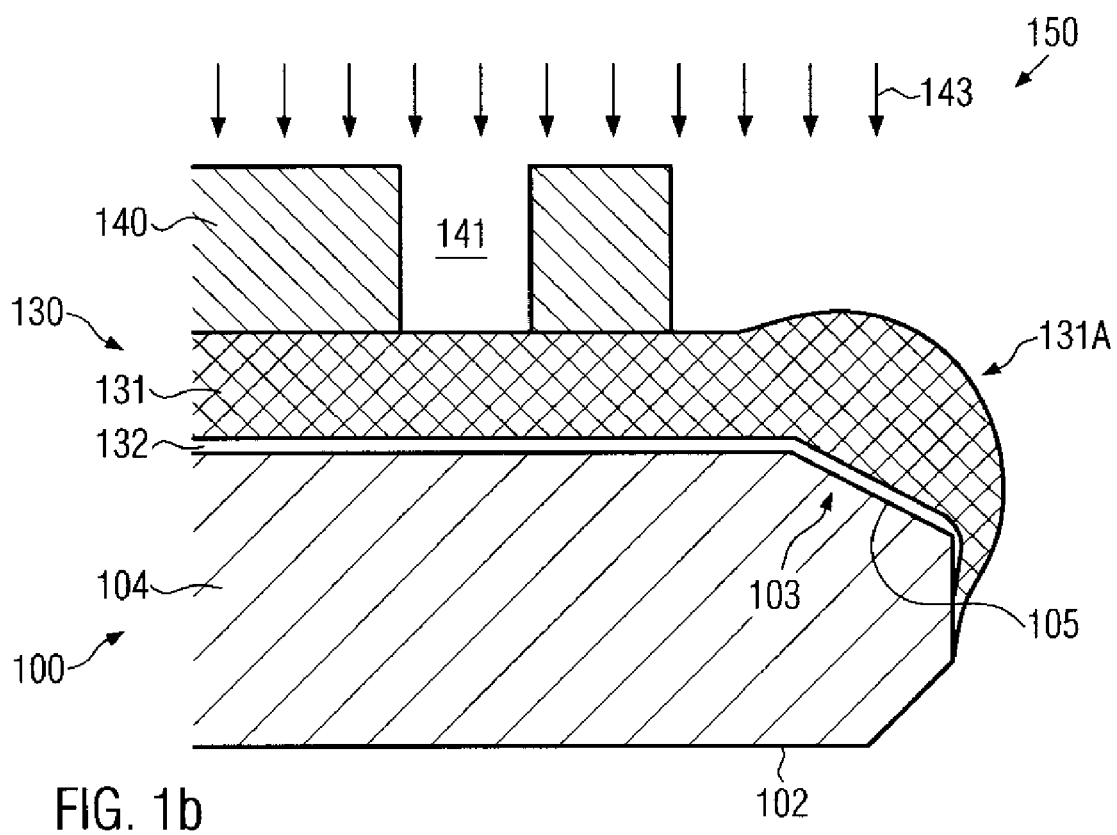
FIGS. 1b-1j schematically show cross-sectional views of a part of the substrate in FIG. 1a, wherein various manufacturing stages during the formation of the metallization layer with removal of unwanted dielectric material from an edge region are illustrated in accordance with illustrative embodiments of the present invention.

FIG. 1b schematically shows a cross-sectional view of a semiconductor device 150 comprising a portion of the substrate 100, wherein the edge region 103 has formed therein a bevel 105. It should be appreciated that, in this manufacturing stage, the substrate 100 may have formed therein and thereon a plurality of circuit elements that are located in the central region 104, wherein, for convenience, any such circuit elements are not shown. Moreover, a dielectric layer stack 130 may be formed above the substrate 100. The dielectric layer stack 130 may comprise an etch stop layer 132 and a dielectric layer 131, which, in one illustrative embodiment, is comprised of a low-k dielectric material. In this respect, a low-k dielectric material has to be understood as an insulating material having a relative permittivity of 3.0 or less. In one particular embodiment, the dielectric layer 131 comprises a material including silicon, carbon, oxygen and hydrogen which is represented by the formula SiCOH. It should be appreciated that the dielectric layer stack 130 may comprise additional layers, such as a capping layer that is usually provided as a last layer of the stack 130 when the dielectric layer 131 is comprised of a low-k dielectric material, which typically exhibits a reduced mechanical stability. Moreover, any intermediate etch stop layers (not shown) or etch indicator layers and the like may be provided in the dielectric layer stack 130 in accordance with process and device requirements. Moreover, a resist mask 140 is formed above the dielectric layer stack 130 and includes an opening 141, which exposes a portion of the dielectric layer stack 130 in which a via opening and/or a trench is to be formed.

The semiconductor device 150 as shown in FIG. 1b may be formed in accordance with the following processes. After the formation of any circuit elements within the central region 104 in accordance with well-established techniques, the dielectric layer stack 130 may be formed by depositing the etch stop layer 132, which may be comprised of silicon nitride, silicon carbide, nitrogen-enriched silicon carbide and the like. The deposition of the etch stop layer 132 may be performed on the basis of well-established plasma enhanced chemical vapor deposition (PECVD) techniques, wherein usually unwanted material in the edge region 103 and on the bevel 105 is deposited in an attempt to increase the central region 104 as much as possible. Furthermore, in many deposition techniques, such as CVD, sputter deposition and the like, the deposition of material may not be reliably restricted to a desired substrate portion without causing other negative effects, in particular for sophisticated semi-conductor devices. Thus, the etch stop layer 132 may also be provided on the edge region 103 including the bevel 105. Thereafter, the dielectric layer 131 may be deposited by any appropriate deposition technique, wherein, in one illustrative embodiment, the dielectric layer 131 is formed by PECVD, wherein at least a portion of the dielectric layer 131 is comprised of a low-k dielectric material. It turns out that, in particular during the plasma-based deposition of low-k dielectric materials, an increased deposition rate is obtained at the bevel 105, thereby creating a portion 131a of increased layer thickness compared to the thickness of the layer 131 in the central region 104. As previously explained, this increased portion 131a may not be reliably removed during the subsequent conventional process flow, in which two or more anisotropic etch processes are performed to pattern the dielectric layer stack 130 for receiving the via openings and the trenches as required for the formation of a metallization layer. After the formation of the dielectric layer 131, any further optional dielectric layers including a capping layer and/or an anti-reflective coating (ARC) layer and the like, the resist mask 140 may be formed according to well-established photolithography techniques. There after, the device 150 may be subjected to an anisotropic etch process 143 to form an opening in the dielectric layer 131 on the basis of the resist mask 140. The anisotropic etch process 143 may be performed on the basis of well-established selective etch recipes, wherein the etch stop layer 132 is used to reliably stop the etch process 143 without unduly affecting any lower-lying device regions. As explained above, any process non-uniformities, especially in the vicinity of the bevel 105 and in particular the increased portion 131a, may result in the formation of a remaining layer stack formed above the bevel 105 after the etch process 143.

Figure 1C:
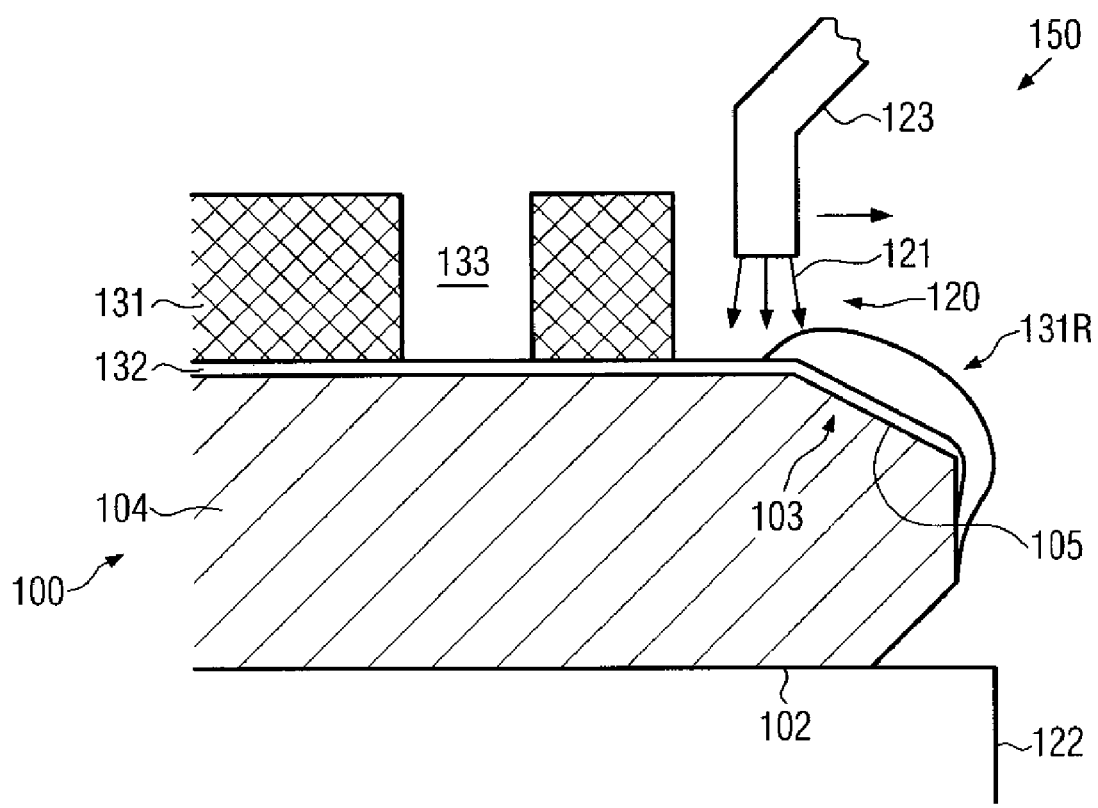

FIG. 1c schematically shows the semiconductor device 150 after the completion of the above-described anisotropic etch process 143. Hence, the dielectric layer stack 130 comprises an opening 133 formed in the dielectric layer 131. Moreover, a residue 131r of the dielectric layer 131 may be formed within a portion of the edge region 103 and in particular above the bevel 105. It should be appreciated that the dimensions of the residue 131r may depend on the excess thickness of the increased portion 131a (FIG. 1b) as well as on process parameters of the anisotropic etch process 143.

Moreover, in FIG. 1c, the device 150 is shown as to be subjected to a wet chemical etch process 120, in which an etchant 121 is applied to the edge region 103 in a highly spatially restricted fashion so that any circuit features are substantially not affected by the etch process 120. For this purpose, the substrate 100 may be placed on a substrate holder 122 of an appropriate etch module (not shown) that is configured to operate on a single substrate basis and to selectively supply the etchant 121, for example by means of a nozzle 123. The nozzle 123 and the substrate holder 122 may be configured to hold and rotate the substrate 100 with an appropriate speed to exert a centrifugal force to the etchant 121, thereby substantially avoiding contact of the etchant 121 with material located in and above the central region 104. An appropriate etch module that enables the selective application of the etchant 121 is, for example, available from Semitool Inc under the trademark Capsule™. It should be noted, however, that the present invention is not restricted to any particular etch tool and may be practiced with any suitable etch tool that enables the highly selective application of the etchant 121. In one illustrative embodiment, the etchant 121 may be comprised of an etch chemistry exhibiting a high etch selectivity with respect to the material of the layer 131 and the etch stop layer 132 so as to enable a highly selective removal of the residue 131r while substantially not affecting the etch stop layer 132. Corresponding highly selective isotropic etch chemistry are well established in the art. In one illustrative embodiment, the etchant 121 may be comprised of a diluted solution of hydrofluoric acid (HF) and/or nitric acid ($HNO_3$). Hereby, the ratio of the de-ionized water, the hydrofluoric acid and/or the nitric acid may be selected in accordance with the desired etch rate, wherein a corresponding appropriate composition may readily be determined on the basis of experimental data and the like. Moreover, the etchant 121 may be configured such that only a negligible material removal of exposed portions of the substrate 100, such as the back side 102, may be observed. More-over, as previously explained, the dimensions of the residue 131r may depend on the process characteristics of the preceding processes and hence the process parameters for the etch process 120 may be selected on the basis of the preceding processes so as to reduce any adverse effects of the etchant 121 on the etch stop layer 132 and/or on the substrate 100. For example, for a given chemical composition of the etchant 121, an appropriate etch time may be established on the basis of test runs for a plurality of process parameters and materials used in the formation of the dielectric layer stack 130.

Figure 1D:
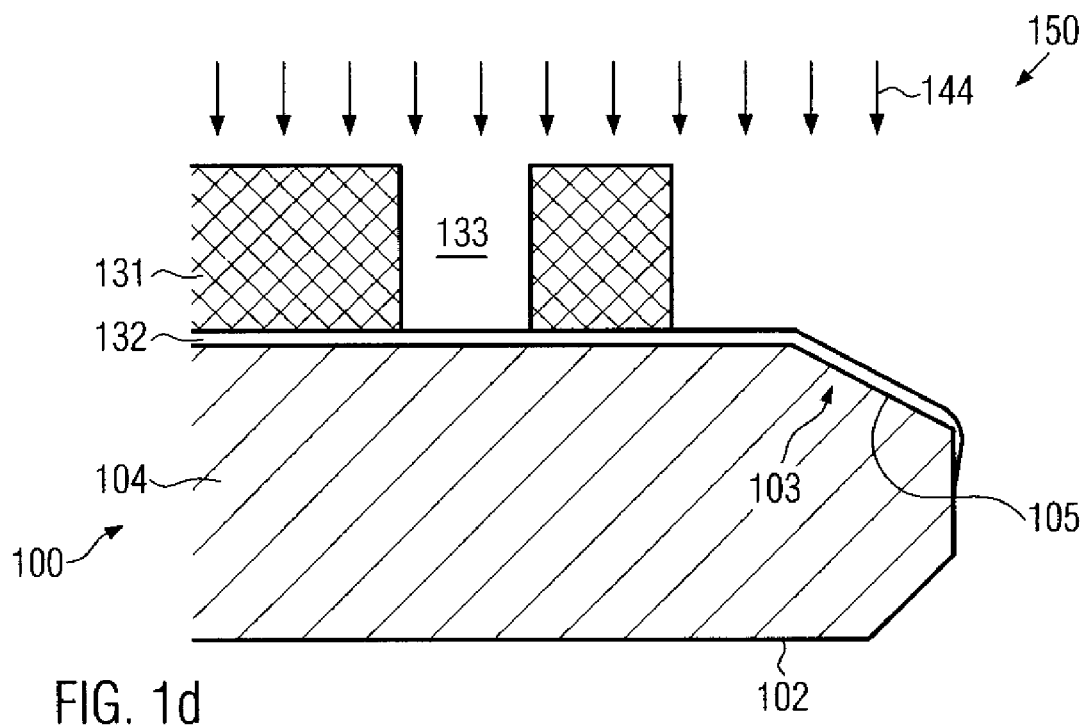

FIG. 1d schematically shows the semiconductor device 150 after the removal of the residue 131r by means of the etch process 120 so that the material of the layer 131 is substantially completely removed from the edge region 103 including the bevel 105. More-over, the device 150 is subjected to a further etch process 144 for removing the etch stop layer 132 from exposed portions, i.e., within the opening 133 and from the edge region 103 including the bevel 105. For example, the etch stop layer 132 may be comprised of silicon carbide that may not be efficiently removed by wet chemical recipes.

Figure 1E:
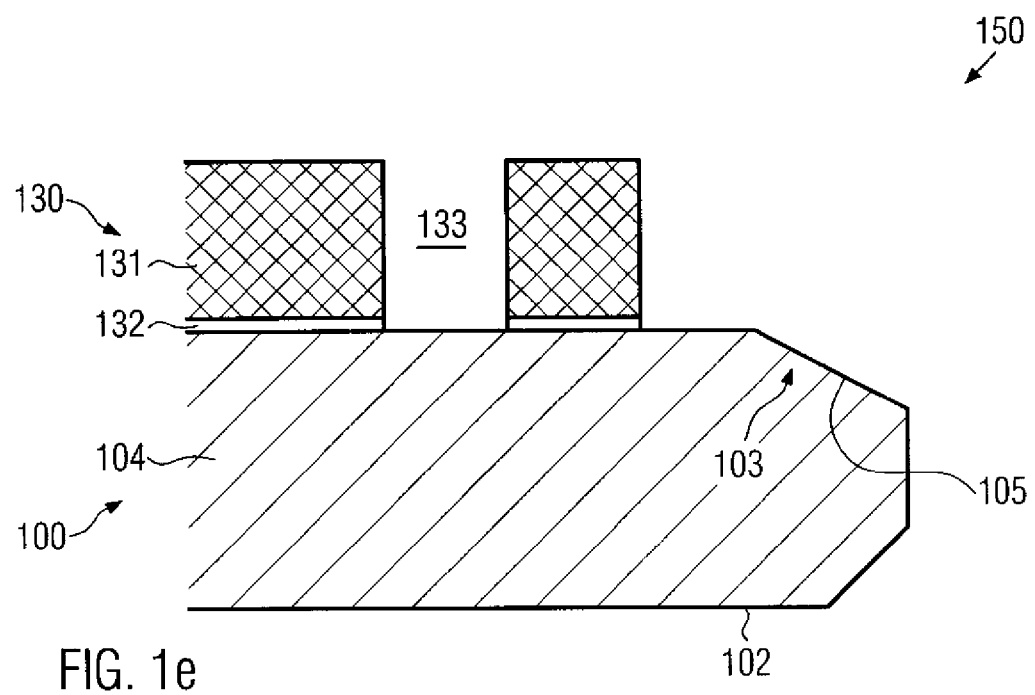

FIG. 1e schematically shows the device 150 after the completion of the etch process 144. Hence, the device 150 comprises the opening 133 that now is also formed through the etch stop layer 132 and may extend to a lower-lying contact region or metal region of a circuit element or a lower-lying metallization layer, respectively. Moreover, the edge region 103 and the bevel 105 are also substantially completely exposed. That is to say, the device 150 may have formed thereon a material layer, such as a dielectric passivation layer from a preceding manufacturing sequence or the like, which exhibits a high etch resistance against the etchant 121. Thus, the edge region 103 and the bevel 105 may be "exposed" to the extent that this material layer is to be considered as the "surface" layer of the edge region 103 and the bevel 105. Due to the high etch resistance of this surface layer, a tendency for under-etching during the preceding etch process 120 for removing the residue 131r is greatly suppressed, thereby also reducing a risk for delamination during the subsequent processing that would otherwise result from under-etched regions in the edge region 103 including the bevel 105.

The opening 133 may represent a via opening or a trench for a metallization layer that is fabricated in accordance with a so-called single damascene technique. Consequently, the further manufacturing process may be continued by depositing one or more barrier and/or adhesion layers, followed by an optional seed layer and an appropriate metallization metal, which in illustrative embodiments comprises copper or copper alloys. Due to the substantially complete removal of the dielectric layer stack in the edge region 103 including the bevel region 105, the probability of contamination and defects during the further process steps may significantly be reduced, as is also explained above.

Figure 1F:
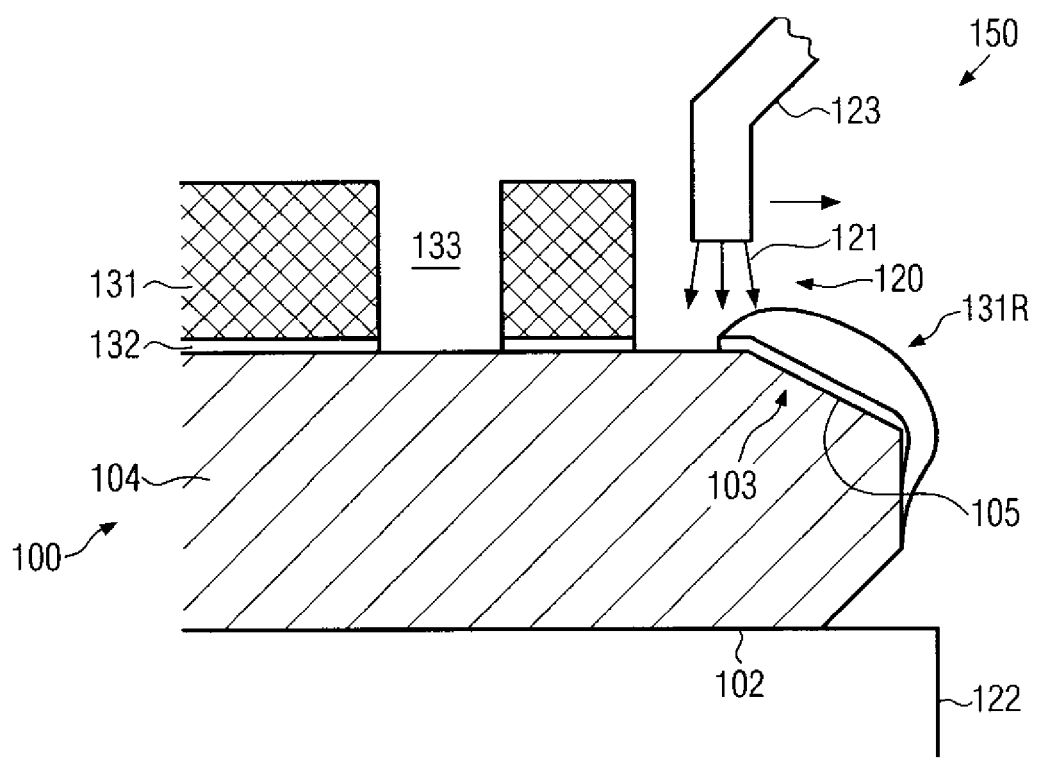

FIG. 1f schematically shows the semiconductor device 150 in a manufacturing stage according to a further illustrative embodiment, in which the opening 133 is already formed so as to extend through the etch stop layer 132, wherein the residue 131r has not been removed prior to the patterning of the etch stop layer 132 within the opening 133. In this case, the etch process 120 for selectively applying the etchant 121 in the edge region 103 may be performed in this phase, wherein the etchant 121 may be configured so as to etch both the material of the layer 131 and the material of the etch stop layer 132. For this purpose, the etchant 121 may be comprised of a solution including chemicals that do not exhibit a pronounced etch selectivity with respect to the dielectric materials of the layers 131 and 132. In other embodiments, the etch process 120 may comprise two etch steps using different chemicals so as to first remove the residue 131r and then remove the etch stop layer 132 over the bevel 105. In the case illustrated in FIG. 1f, the patterning process for forming the opening 133 in the dielectric layer stack 130 may be performed with high compatibility to conventional processes and thereafter the removal of any dielectric residues may be performed by means of the etch process 120. For instance, the etch stop layer may be comprised of silicon nitride, which may be effectively removed by wet chemical recipes on the basis of hot phosphoric acid, while the residue 131r may be etched based on HF.

Figure 1G:
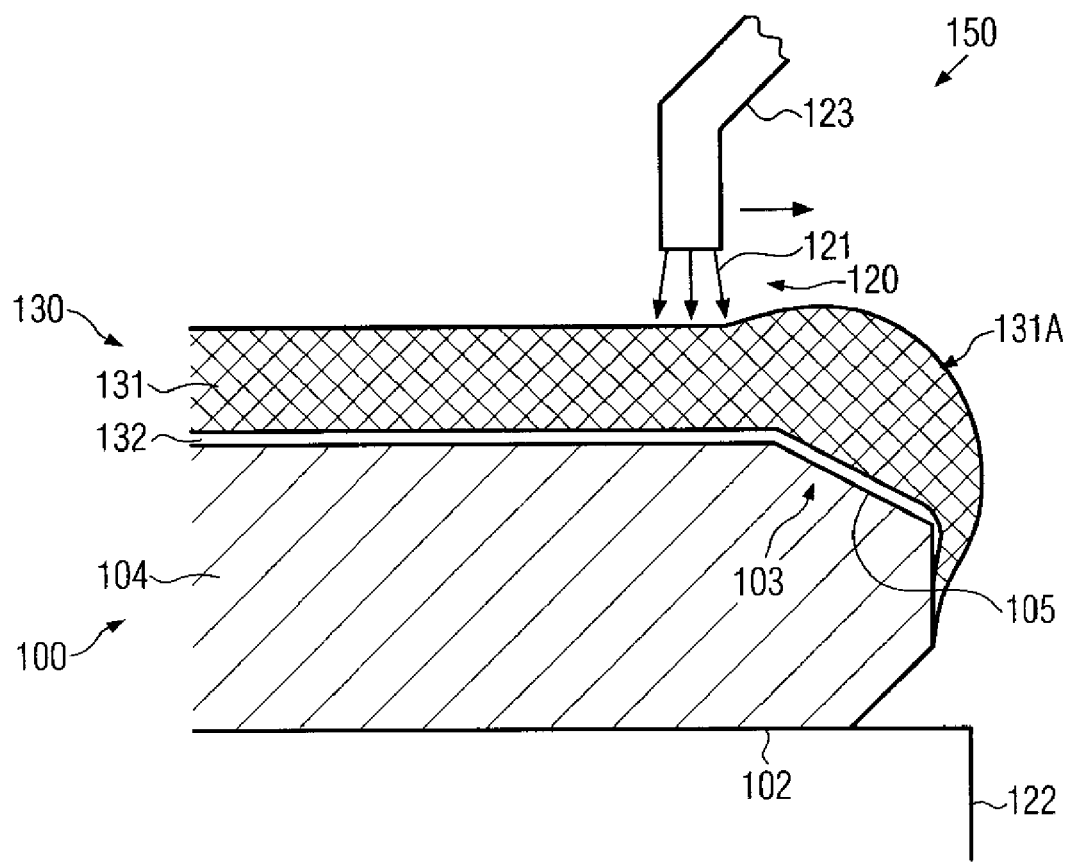

FIG. 1g schematically shows the semiconductor device 150 in a manufacturing stage in which the dielectric layer stack 130 is formed above the substrate 100 in a non-patterned state. Moreover, the device 150 is subjected to the etch process 120 prior to performing any etch step for patterning the dielectric layer stack 130 within the central region 104. In one illustrative embodiment, the etchant 121 may be selected to exhibit a moderately high etch selectivity between the layer 131 and the etch stop layer 132 so that the etch process 120 may be reliably stopped in and on the etch stop layer 132, when the etch front reaches the etch stop layer 132 in the edge region 103 including the bevel 105. In other embodiments, the etch process 120 may be designed to remove only a significant portion of the layer 131 in the edge region 103 and above the bevel 105 so as to guarantee a substantially complete removal of the remaining material of the layer 131 during the subsequent patterning of the dielectric layer stack 130 in the central region 104.

Figure 1H:
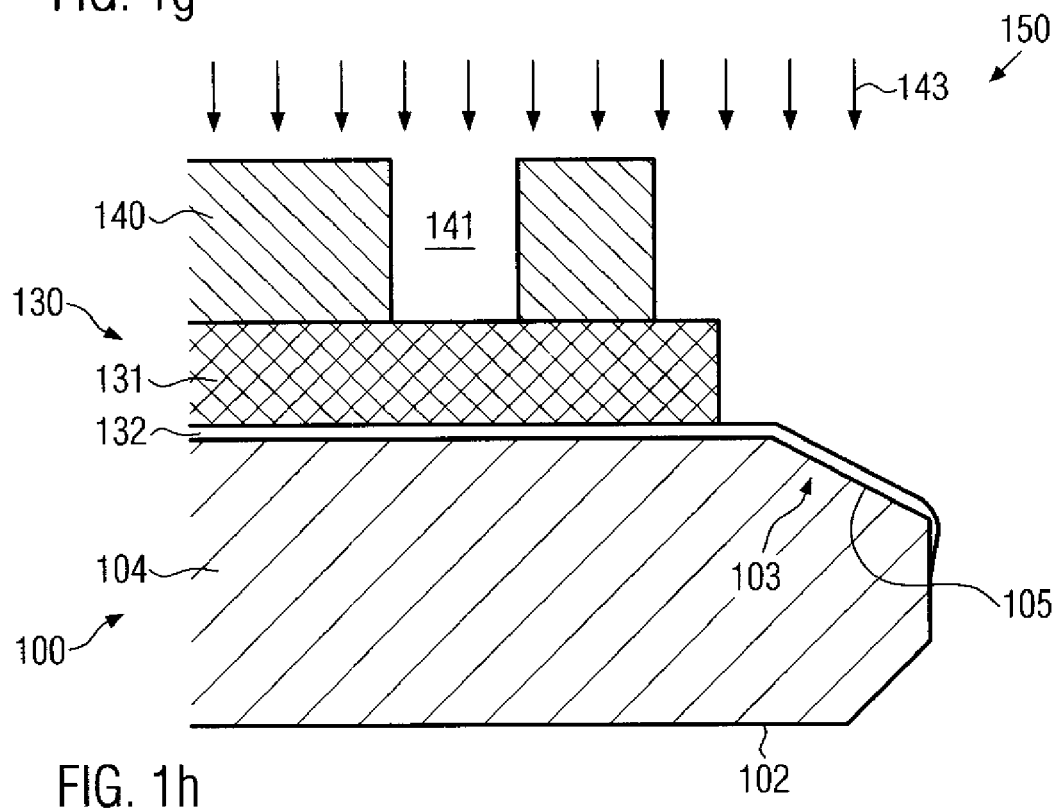

FIG. 1h schematically shows the semiconductor device 150 after the completion of the etch process 120, according to the embodiment in which the portion 131a is substantially completely removed. Moreover, the device 150 is subjected to the anisotropic patterning process 143 on the basis of the resist mask 140. During the etch process 143, the exposed portion of the etch stop layer 132 in the edge region 103 and the bevel 105 may also be attacked and to a certain degree or substantially completely removed.

Figure 1I:
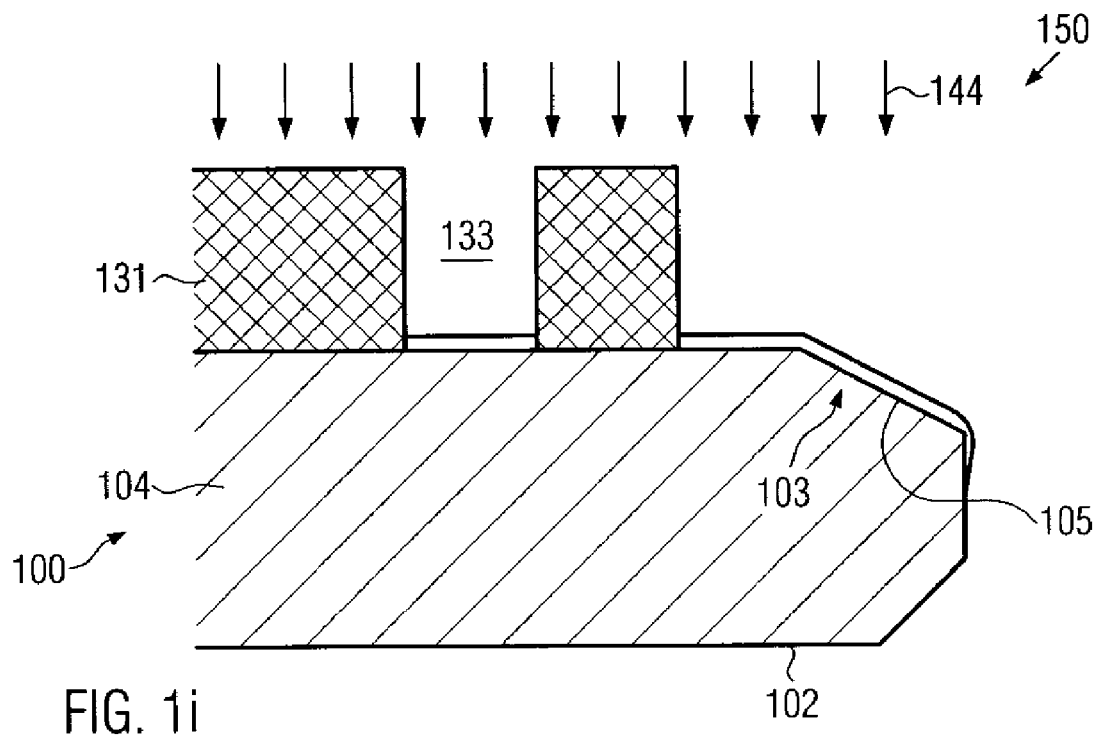

FIG. 1i schematically shows the device 150 after the completion of the etch process 143 and the removal of the resist mask 140. Thus, the device 150 comprises the opening 133 formed in the dielectric layer 131. During the subsequent etch process 144, the etch stop layer 132 within the opening 133 may be removed, while at the same time any residues of the etch stop layer 132 in the edge region 103 and the bevel 105 may also be removed. As previously explained, the portion 131a may not need to be completely removed during the etch process 120 of FIG. 1g but may be reduced in size so as to enable a substantially complete removal during the subsequent process 143. Thereafter, the exposed portions of the etch stop layer 132 may then be removed in the etch process 144. Consequently, in the embodiments described with reference to FIGS. 1d-1i, a high degree of compatibility with the conventional etch regime for patterning the dielectric layer stack 130 may be maintained, since the etch process 120 may be performed prior to the process sequence for patterning the stack 130.

Figure 1J:
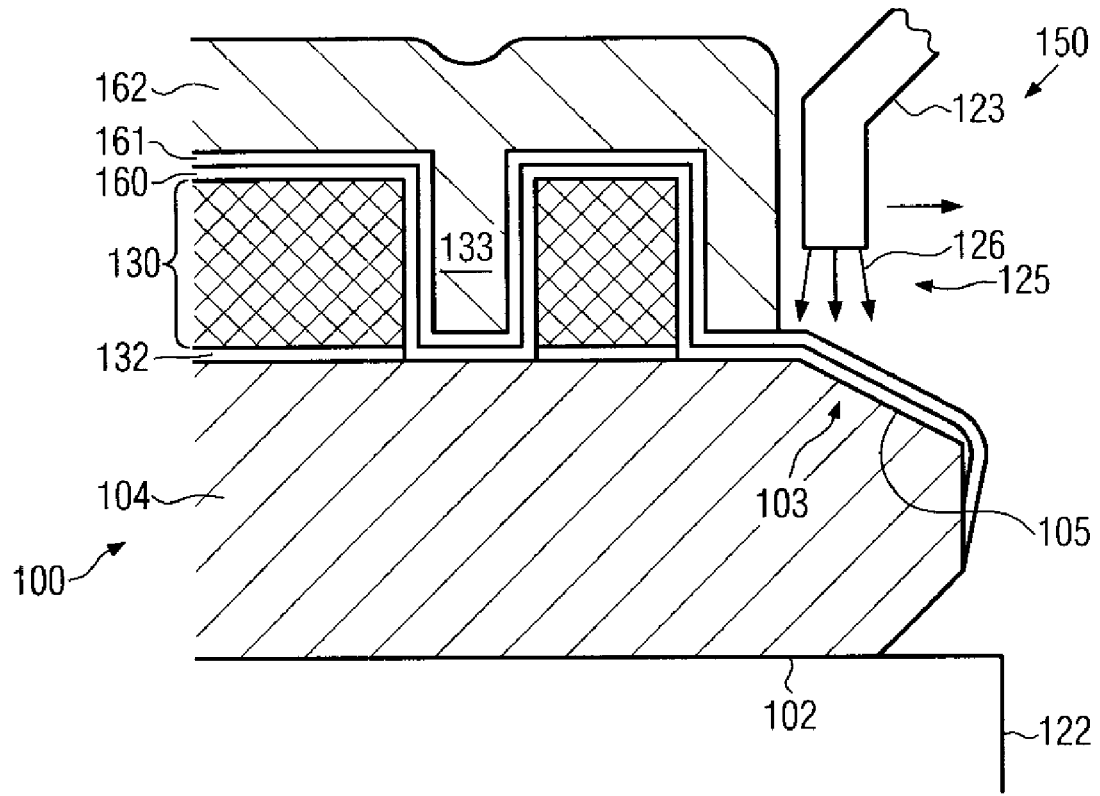

FIG. 1j schematically shows the semiconductor device 150 in a further advanced manufacturing stage that may be based on any of the above-described embodiments. The device 150 may comprise a barrier layer 160 formed on the patterned dielectric layer stack 130 and on exposed portions of the edge region 103 including the bevel 105. The barrier layer 160 may comprise any appropriate material, such as titanium, tantalum, titanium nitride, tantalum nitride and the like, which provides the required adhesion and diffusion blocking characteristics. In one illustrative embodiment, the barrier layer 160 may comprise tantalum and may, in some embodiments, include one or more sub-layers comprising, for instance, tantalum nitride, to provide enhanced adhesion and copper blocking efficiency. A seed layer 161 may be formed above the barrier layer 160 and may comprise material that enhances the deposition efficiency of a subsequent electrochemical deposition technique, such as electro-plating. For example, the seed layer 161 may be comprised of copper to enhance the current carrying efficiency in a subsequent electroplating process. A metal layer 162, which in one illustrative embodiment comprises copper or any alloy thereof, is formed at least above the central region 104.

The device 150 as shown in FIG. 1j may be formed according to the following process flow. After the patterning of the dielectric layer stack 130, the barrier layer 160 may be formed by, for instance, sputter deposition, CVD, atomic layer deposition (ALD) and the like, wherein any appropriate cleaning processes may be performed prior to the actual deposition to remove any contaminants from exposed portions of contact and metal regions in the central region 104 and the edge region 103. For example, well-established process recipes for sputter depositing tantalum, tantalum nitride, titanium, titanium nitride and the like may be used to form the barrier layer 160 having the desired composition and thickness. As previously explained, many deposition techniques may not be effectively restricted to the central region 104 and hence usually the barrier layer 160 is also deposited on the edge region 103 including the bevel 105. Thereafter, the seed layer 161 may be deposited, for instance by using well-established sputter deposition techniques, an electroless plating process and the like. Next, the metal layer 162 may be formed by an electrochemical deposition technique, such as electroplating or electroless plating, wherein, depending on the tool configuration, the deposition of the metal layer 162 may be substantially restricted to the central region 104 so that at least a portion of the edge region 103 and the bevel 105 may not receive significant amounts of the metal, such as copper or copper alloy, of the layer 162. However, tiny amounts of copper may nevertheless be deposited in the edge region 103 and the bevel 105, wherein the barrier layer 160 may prevent any unwanted copper diffusion into lower-lying device regions.

After the deposition of the metal layer 162, the device 150 may, according to one particular embodiment, be subjected to a further wet chemical etch process 125, during which an etchant 126 is supplied to the edge region 103 including the bevel 105 in a highly spatially restricted manner so that material in the central region 104 is substantially not affected by the etch process 125. For this purpose, substantially the same process tools may be used, as are previously described with reference to the etch process 120. Thus, any appropriate etch tool configured to process substrates on a single substrate basis and having the nozzle 123 may be used to locally selectively apply the etchant 126, substantially without affecting the central region 104. The etch process 125 may be designed to reliably remove any residues of the metal layer 162, such as copper and copper alloys, and also to remove the seed layer 161 and the barrier layer 160. For this purpose, the etchant 126 may, in one illustrative embodiment, be comprised of a diluted mixture of hydrofluoric acid (HF) and nitric acid ($HNO_3$), the ratio of which may be selected on the basis of the materials comprised in the layers 162, 161 and 160. For instance, copper and tantalum may be frequently used in highly sophisticated metallization layers. In some embodiments, the etch process 125 may comprise different etch steps, such as an etch step based on an etch recipe including a mixture of sulfuric acid and hydrogen peroxide to enable an efficient removal of copper substantially without creating highly toxic nitric oxides. Thereafter, a second etch step may be performed on the basis of the above-identified chemicals, hydrofluoric acid and nitric acid, to efficiently remove the barrier layer 160. Thereafter, the further processing of the device 150 may be continued by, for instance, removing any excess material of the metal layer 162 and of the seed layer 161 and the barrier layer 160, thereby creating an electrically insulated conductive via or line in the form of the metal-filled opening 133. Due to the removal of dielectric materials in the edge region 103 and the bevel 105, in the further processing of the device 150 during the removal of excess material, which may be accomplished by CMP, the probability of obtaining an increased defect rate and significant tool contamination may be reduced. Due to the removal of copper and copper alloys, as well as of the seed layer 161 and barrier layer 160 especially in the critical bevel region 105, the risk of delamination during further processing of the device 150 and in particular during the further formation of subsequent metallization layers may even further be reduced. Moreover, since the substrate handling and the processing of the device 150 is less critical compared to a conventional process flow, the size D (FIG. 1a) may be reduced and may therefore only be restricted by the substrate handling requirements rather than by contamination and defect criteria. In this way, the area available for formation of circuit elements may be increased.

With reference to FIGS. 2a-2d, further illustrative embodiments will now be described in more detail, in which a so-called dual damascene approach is used for the formation of a metallization layer.

Figure 2A:
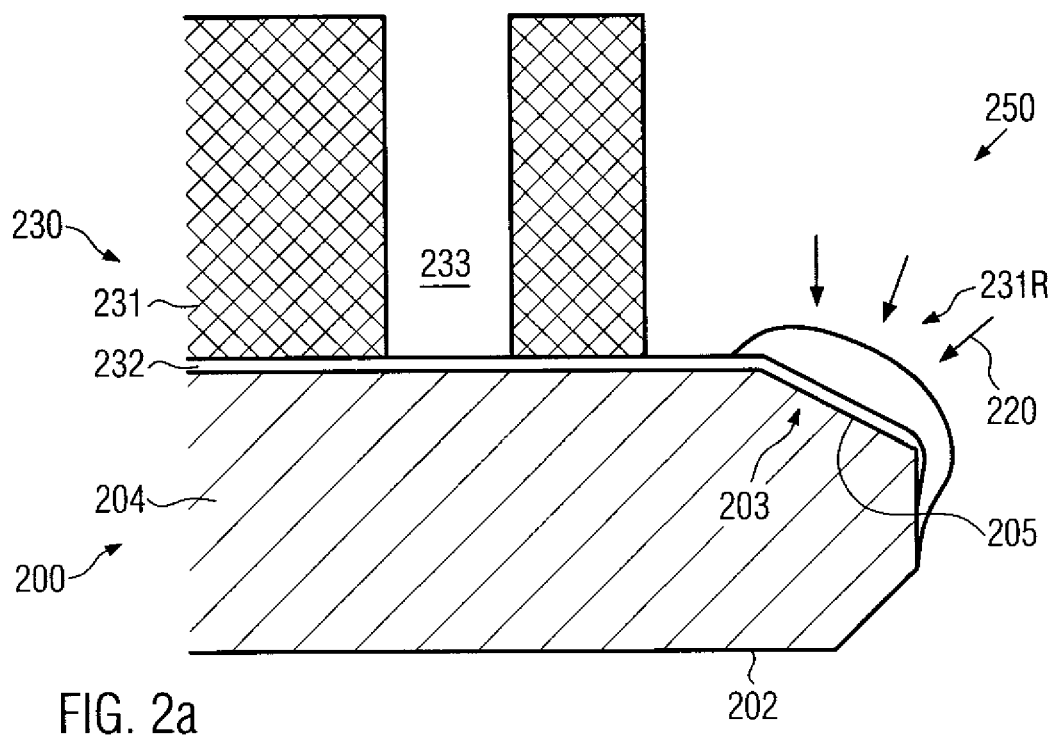
FIGS. 2a-2d schematically show cross-sectional views of a semiconductor device during the formation of a metallization layer in accordance with a dual damascene technique, wherein at least unwanted dielectric material is removed from an edge region prior to the deposition of conductive barrier and metal material according to further illustrative embodiments of the present invention.

In FIG. 2a, a semiconductor device 250 comprises a substrate 200 including a central region 204 and an edge region 203 including a bevel 205. Moreover, the device 250 comprises a partially patterned dielectric layer stack 230 that may be provided for the formation of a metallization layer of the device 250. The dielectric layer stack 230 may comprise an etch stop layer 232 and at least one dielectric layer 231, which, in one illustrative embodiment, may be comprised of a low-k dielectric material. The dielectric layer stack 230 may include a via opening 233, which extends, in this stage of manufacturing, down to the etch stop layer 232. Moreover, a portion 231r of material of the dielectric layer 231 may still be present in the edge region 203 and especially above the bevel 205.

The device 250 as shown in FIG. 2a may be formed in accordance with a conventional damascene strategy, in which the via is formed first, followed by patterning of a corresponding trench. Hence, the via opening 233 may be formed by well-established photolithography and etch techniques, wherein the residue 231r may still remain at least above the bevel 205. Next, the device 250 is subjected to an etch process 220 to remove dielectric material in a locally restricted fashion within the edge region 203 and the bevel 205. With respect to process specifics of the etch process 220, the same criteria apply as previously explained with reference to the etch process 120. That is, an appropriate etchant may be supplied to the edge region 203, wherein the etchant may exhibit a moderately high etch selectivity with respect to the material of the residue 231r and the etch stop layer 232 so as to substantially remove the residue 231r without substantially affecting the etch stop layer 232. For example, the etch stop layer 232 may be comprised of silicon carbide. In other illustrative embodiments, the etch process 220 may be configured to remove the residue 231r and the etch stop layer 232 within the edge region 203 and the bevel 205. For this purpose, two different etch chemistries may be supplied sequentially or a single chemistry with a low selectivity between the material of the layers 231 and 232, while exhibiting a high selectivity to any material beneath the etch stop layer 232, may be used.

Figure 2B:
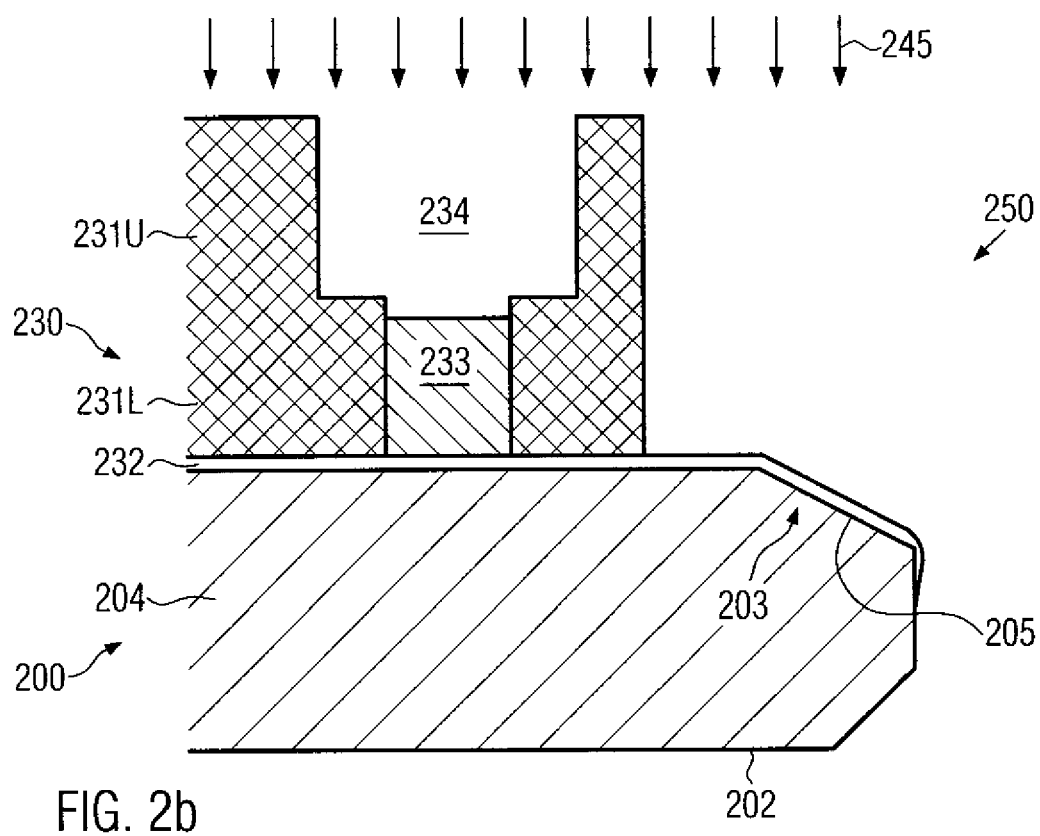

FIG. 2b schematically shows the device 250 in a further advanced manufacturing stage. Here, the device 250 may be subjected to a trench etch process 245 for forming a trench 234 in an upper portion 231u of the dielectric layer 231, while maintaining the via opening 233 in a lower portion 231l of the dielectric layer 231. The trench etch process 245 may be performed in accordance with well-established dual damascene strategies, wherein the via opening 233 may be filled by an appropriate protective material, such as photoresist, an organic ARC material and the like. In one illustrative embodiment, the edge region 203 may not be covered by the protective material and is thus exposed to the etch process 245, thereby further removing any residues of the layer 231 and also attacking and partially removing the etch stop layer 232. Thereafter, the etch stop layer 232 within the opening 233 may be exposed and may be opened in accordance with well-established etch recipes, thereby also efficiently removing the etch stop layer 232 or residual portions thereof from the edge region 203 including the bevel 205. Thereafter, the further processing may be continued by depositing a barrier layer, a seed layer and a corresponding metal layer as is also described with reference to FIG. 1j. Moreover, in illustrative embodiments, the etch process 125 described with reference to the device 150 in FIG. 1j may also be used in combination with the device 250 having received the corresponding barrier, seed and metal layers. It should further be appreciated that the etch process 220 may be performed in other manufacturing stages, as is also described with reference to FIGS. 1e-1i, depending on process requirements. That is, the etch process 220 may, in illustrative embodiments, be performed prior to the patterning of the dielectric layer stack 230 so as to form the via opening 233, wherein the dielectric layer 231 may be substantially completely or at least partially removed so that a remaining portion of the dielectric layer 231 may reliably be removed during the etch process for forming the via opening 233.

Figure 2C:
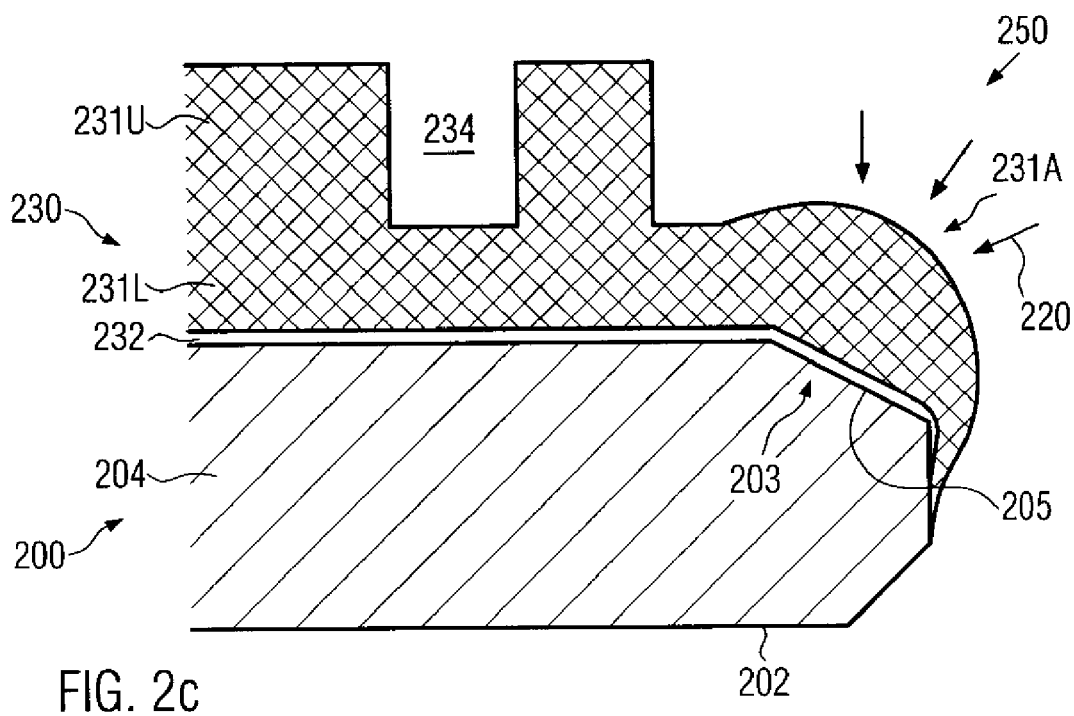

FIG. 2c schematically shows the device 250, when the dielectric layer stack 230 is patterned in accordance with a dual damascene strategy, in which respective trenches are patterned prior to the formation of any via openings. Hence, the device 250 in FIG. 2c comprises the trench 234 that is formed in the upper portion 231u of the layer 231. More-over, the device 250 may be subjected to the etch process 220, wherein, as previously discussed, the etch process 220 may be performed prior to the patterning of the trench 234 or may be performed, as is shown in FIG. 2c, after the patterning of the trench 234 to remove or at least significantly reduce the dielectric layer 231 in the edge region 203 and especially above the bevel 205.

Figure 2D:
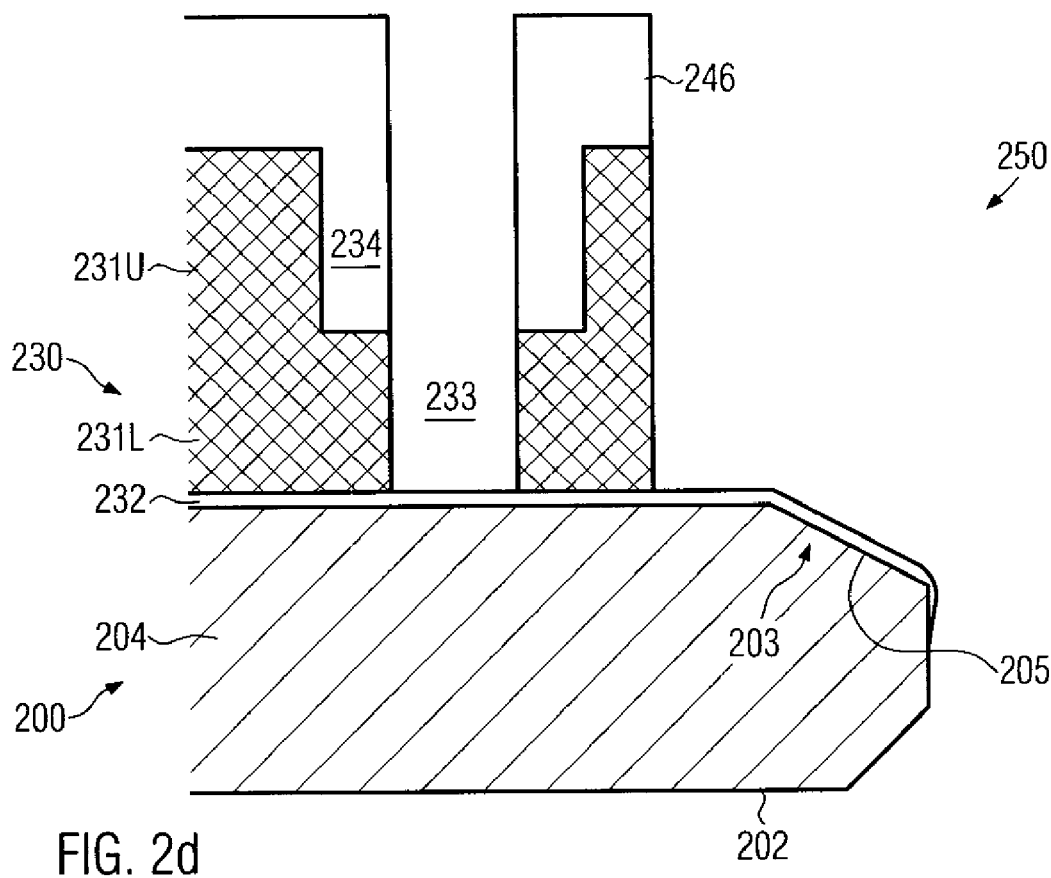

FIG. 2d schematically shows the device 250 during the patterning of the via opening 233 within the lower portion 231l of the dielectric layer 231. To this end, a corresponding resist mask 246 may be formed, which is used as an etch mask during an etch process 247. During the etch process 247, residues of the layer 231 in the edge region 203 including the bevel 205 may be removed, for instance, if the etch process 220 may have not completely removed the material of the layer 231 and/or may also remove a portion of the etch stop layer 232. Thereafter, the etch stop layer 232 within the opening 233 may be removed according to well-established etch processes, wherein any residues of the etch stop layer 232 in the edge region 203 including the bevel 205 may be removed. Thereafter, further processing may be continued as described above with reference to FIG. 2b, wherein the etch process 125 may also be applied after the formation of respective barrier, seed and metal layers.

As a result, the present invention provides an enhanced technique for the formation of metallization layers, particularly of copper-based metallization layers comprising a low-k dielectric material deposited by CVD techniques, in which at least one additional wet etch step is performed to substantially remove the dielectric material above the bevel of the substrate in a highly spatially selective manner without substantially affecting the central region of the substrate. To this end, the wet chemical etch process may be designed in accordance with the composition of the dielectric layer to be removed from the bevel such that an under-etching, that is, an etch attack to a layer below the layer to be removed, is substantially prevented, while the unwanted dielectric material, such as a low-k dielectric, is efficiently removed. Moreover, any layers that may not be efficiently removed by wet chemical spatially restricted etch processes, such as silicon carbide acting as an etch stop layer, this layer may be provided on the edge region and the bevel such that they may remain there substantially without causing a delamination in the further processing, thereby acting as a "surface layer" as previously described, or these layers may be subsequently removed by a plasma-based etch process. Moreover, the wet etch process is performed prior to the deposition of any conductive metals and barrier materials, thereby significantly reducing the probability of substrate and tool contamination. Thus, a significant increase of production yield may be obtained, while a high degree of compatibility with well-approved single and dual damascene approaches is still maintained. Additionally, in particular embodiments, the barrier material, such as tantalum, as well as any excess metal or seed layer material, may also be removed by a wet chemical process, in which the etchant is selectively applied to the edge region and the bevel. Consequently, copper contamination and the "flaking off" of barrier materials, such as tantalum, tantalum nitride and the like, may be effectively suppressed, thereby providing the potential for obtaining a high production yield, even in sophisticated applications requiring the formation of a plurality of stacked metallization layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a dielectric layer stack for a metallization layer above a substrate having a central region adjacent to an edge region;
   selectively removing at least one layer of said dielectric layer stack from said edge region by selectively applying an etchant to said edge region such that the etchant substantially avoids contact with the central region by rotating the substrate such that centrifugal force draws the etchant away from the central region while applying the etchant;
   patterning said dielectric layer stack in said central region to receive at least one of a via and a trench; and
   depositing a conductive barrier layer above said patterned dielectric layer stack after selectively applying said etchant to said edge region.

2. The method of claim 1, wherein forming said dielectric layer stack comprises depositing a dielectric etch stop layer and forming a dielectric layer comprising a low-k material on said etch stop layer.

3. The method of claim 2, wherein said etchant is selectively applied to remove said dielectric layer in said edge region prior to patterning said dielectric layer stack in said central region.

4. The method of claim 2, wherein patterning said dielectric layer stack comprises forming at least one via opening in said dielectric layer in a first etch process and etching through said etch stop layer within said via opening in a second etch process.

5. The method of claim 4, wherein selectively applying said etchant substantially completely removes said etch stop layer and said dielectric layer.

6. The method of claim 2, wherein patterning said dielectric layer stack comprises forming a via opening at least in a lower portion of said dielectric layer stack and forming a trench in an upper portion of said dielectric layer stack.

7. The method of claim 6, wherein said trench is formed prior to forming said via opening, and wherein said etchant is selectively applied prior to forming said trench.

8. The method of claim 1, farther comprising depositing a metal layer on said baffler layer in said central region and removing said barrier layer from said edge region by selectively applying a second etchant to said edge region.

9. The method of claim 8, wherein said metal comprises copper.

10. The method of claim 8, wherein depositing a metal layer on said barrier layer comprises forming a seed layer on said barrier layer and electrochemically depositing metal on said seed layer.

11. The method of claim 10, farther comprising removing said seed layer from said edge region.

12. The method of claim 8, wherein said second etchant comprises a diluted compound of nitric acid and hydrofluoric acid.

* * * * *